(12) United States Patent
Tsuji et al.

(10) Patent No.: US 7,122,091 B2
(45) Date of Patent: Oct. 17, 2006

(54) STRUCTURE OF RETAINING CUT-PROCESSED COMPONENTS, METHOD OF FABRICATING CUT-PROCESSED COMPONENTS, TRAY FOR HOUSING CUT-PROCESSED COMPONENTS, AND METHOD OF CLEANING CUT-PROCESSED COMPONENTS

(75) Inventors: Hiroyuki Tsuji, Nogoya (JP); Kazumasa Kitamura, Ichinomiya (JP)

(73) Assignee: NGK Insulators, Ltd., Nagoya City (JP)

( * ) Notice: Subject to any disclaimer, the term of this patent is extended or adjusted under 35 U.S.C. 154(b) by 185 days.

(21) Appl. No.: 10/359,005

(22) Filed: Feb. 5, 2003

(65) Prior Publication Data

US 2003/0178216 A1    Sep. 25, 2003

(30) Foreign Application Priority Data

Feb. 6, 2002    (JP) ............................. P2002-029448

(51) Int. Cl.
B32B 31/26    (2006.01)

(52) U.S. Cl. .................. 156/250; 156/85; 156/259

(58) Field of Classification Search ............ 52/745.19, 52/746.1, 745.1, 745.019; 156/250, 85, 259
See application file for complete search history.

(56) References Cited

U.S. PATENT DOCUMENTS

| | | | | |
|---|---|---|---|---|
| 3,084,403 | A * | 4/1963 | Elmendorf | .................. 428/166 |
| 4,166,001 | A * | 8/1979 | Dunning et al. | ............. 162/111 |
| 4,199,645 | A * | 4/1980 | Schwarz | ...................... 428/339 |
| 4,356,676 | A * | 11/1982 | Hauptman | ............... 52/396.04 |
| 5,704,105 | A * | 1/1998 | Venkataramani et al. | .. 29/25.35 |
| 5,758,396 | A * | 6/1998 | Jeon et al. | .................. 29/25.35 |
| 5,976,691 | A * | 11/1999 | Noguchi et al. | ............. 428/354 |
| 5,980,675 | A * | 11/1999 | Tsuchihashi et al. | ........ 156/197 |
| 5,985,067 | A * | 11/1999 | Schmid et al. | ........... 156/89.16 |
| 6,176,966 | B1 * | 1/2001 | Tsujimoto et al. | .......... 156/344 |
| 6,210,514 | B1 * | 4/2001 | Cheung et al. | ............. 156/241 |
| 6,374,761 | B1 * | 4/2002 | Dhellemmes | ............. 114/74 A |
| 6,484,789 | B1 * | 11/2002 | Ober | .......................... 160/354 |
| 6,603,240 | B1 * | 8/2003 | Kohno et al. | ............... 310/334 |
| 6,702,910 | B1 * | 3/2004 | Noguchi et al. | .............. 156/85 |

FOREIGN PATENT DOCUMENTS

| | | |
|---|---|---|
| JP | 50-056066 | 5/1975 |
| JP | 53-112590 | 10/1978 |
| JP | 59-213486 | 12/1984 |
| JP | 63-055986 | 3/1988 |
| JP | 01-244682 A1 | 9/1989 |
| JP | 02-098179 | 4/1990 |
| JP | 2000-074739 | 3/2000 |
| JP | 2001-284163 | 10/2001 |
| JP | 2001-320103 | 11/2001 |
| JP | 2002-050807 | 2/2002 |
| JP | 2002-299713 | 10/2002 |
| JP | 05-169425 A1 | 7/2003 |

* cited by examiner

Primary Examiner—Carl D. Friedman
Assistant Examiner—Basil Katcheves
(74) Attorney, Agent, or Firm—Burr & Brown

(57) ABSTRACT

A structure of retaining cut-processed components includes a first base (18A). The structure includes cut-processed components (1A) removably fixed to the first base, with the cut-components aligned with each other in a longitudinal direction of the first base. The cut-processed components have first and second cut surfaces (1Aa, 1Ab) parallel to each other. First cut surfaces are positioned flush with each other. Second cut surfaces are positioned flush with each other. The cut-processed components are fixed to the first base by a dissoluble adhesive (20).

2 Claims, 19 Drawing Sheets

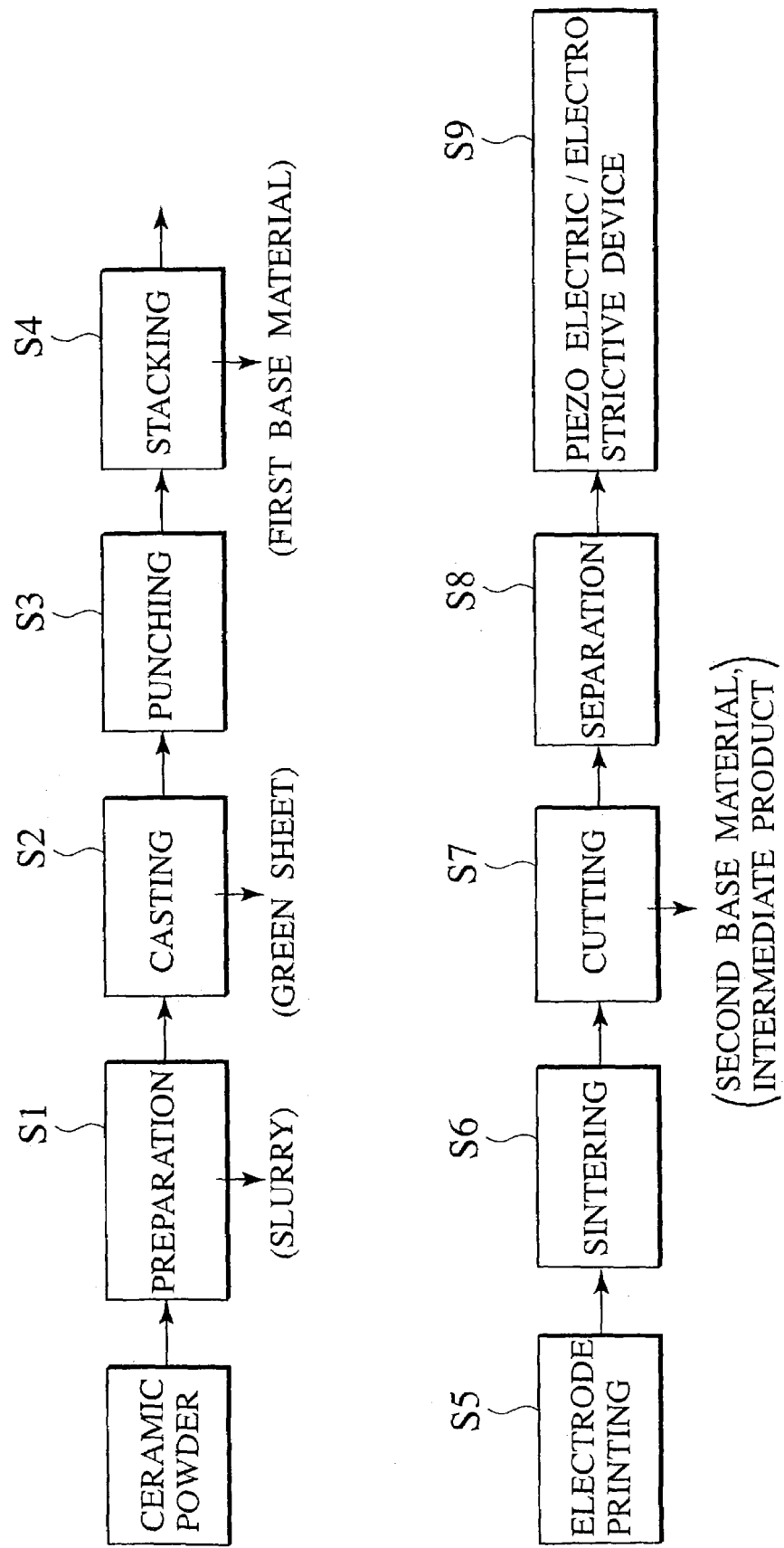

STRUCTURE OF RETAINING CUT-PROCESSED COMPONENTS, METHOD OF FABRICATING CUT-PROCESSED COMPONENTS, TRAY FOR HOUSING CUT-PROCESSED COMPONENTS, AND METHOD OF CLEANING CUT-PROCESSED COMPONENTS

BACKGROUND OF THE INVENTION

This invention relates to a structure of retaining cut-processed components and to a method of cleaning cut-processed components. More specifically, this invention relates to a structure of retaining cut-processed components such as electronic components, a method of manufacturing the same, a tray for housing cut-processed components, and a method of cleaning cut-processed components.

Cut-processed components are manufactured in various technical fields. Cut-processed components include various finished products and intermediate products, which are typically piezoelectric devices provided with piezoelectric/electrostrictive elements, electronic components such as chip capacitors, cut-processed products showing magnetic performances, products which exert strong absorption, and micro components having large surface areas relative to volumes, for example. In general, these cut-processed components are formed by cutting a base material with a dicer, a wire saw, or the like. The cut-processed components are housed orderly in a housing tray, for example, by hands of an operator one by one, or housed orderly in the housing tray by using a part feeder.

SUMMARY OF THE INVENTION

However, the above-described piezoelectric devices, the electronic components, the cut-processed products with magnetic performances, the products exerting strong absorption, the micro components having large surface areas relative to the volumes, and the like become entwined to one another when they are sorted and arranged with a part feeder. Accordingly, it is difficult to sort and arrange such components favorably.

Shock caused by vibration of the part feeder leads the cut-processed components to breakage or deterioration.

An object of the present invention is to provide a retaining structure for cut-processed components, which can retain cut-processed components unsuitable for a part feeder without causing breakage or deterioration.

Another object of the present invention is to provide a method of manufacturing cut-processed components, which effectuates efficient arrangement of the cut-processed components unsuitable for a part feeder.

Another object of the present invention is to provide a method which effectuates cleaning of cut-processed components as well as arrangement and housing of the cut-processed components.

Another object of the present invention is to provide a tray for housing cut-processed components and a cleaning method. The tray is capable of housing cut-processed components in good arrangement and of improving cleaning efficiency.

The first aspect of the invention is directed to a structure of retaining cut-processed components. The structure includes a first base. The structure includes cut-processed components removably fixed to the first base, with the cut-processed components aligned with each other in a longitudinal direction of the first base. The cut-processed components have first and second cut surfaces parallel to each other. First cut surfaces are positioned flush with each other. Second cut surfaces are positioned flush with each other.

Preferably, the first base has opposed first and second sides in the longitudinal direction. A first side is positioned flush with the first cut surfaces. A second side is positioned flush with the second cut surfaces.

Preferably, the cut-processed components are fixed to the first base by a dissoluble adhesive.

Preferably, the adhesive is reduced in adhesive strength with one of a dissoluble agent and ultraviolet.

The second aspect of the invention is directed to a method of fabricating cut-processed components. The method includes the step of adhering base materials to a first base with a first adhesive. The method includes the step of cutting the base materials in a direction into cut-processed components, with the cut-processed components in alignment with each other on the first base.

Preferably, the first base is cut together with the base material.

Preferably, the first base adhered to a second base with a second adhesive different from the first adhesive in dissoluble condition.

Preferably, the base material is cut together with the first base, before the first and second bases are separated from each other, with the cut-processed components adhered to the first base.

The third aspect of the invention is directed to a tray for housing the cut-processed components according to the first aspect. The tray includes a channel housing the first base. The tray includes recesses communicating with the channel for housing the cut-processed components therein, respectively.

Preferably, at least one of the channel and recesses has a bottom defining a hole vertically therethrough.

The fourth aspect of the invention is directed to a method of washing the cut-processed components according to the first aspect. The method includes the step of providing a tray including recesses and a channel in communication with each other. The method includes the step of housing the cut-processed components in the recesses respectively. The method includes the step of housing the first base in the channel. The method includes the step of washing the cut-processed components in the recesses and the base in the channel.

Preferably, the method further includes the step of pouring a dissolutive agent in the recesses and the channel to dissolve an adhesive between the cut-processed components and the first base. The method includes the step of separating the first base and the cut-processed components from each other. The method includes the step of pouring a detergent in the recesses to wash the cut-processed components in the recesses.

BRIEF DESCRIPTION OF THE ACCOMPANYING DRAWINGS

FIG. 2 is a flowchart showing respective steps for manufacturing the device of FIG. 1.

DETAILED DESCRIPTION OF THE PREFERRED EMBODIMENTS

Figure 1:
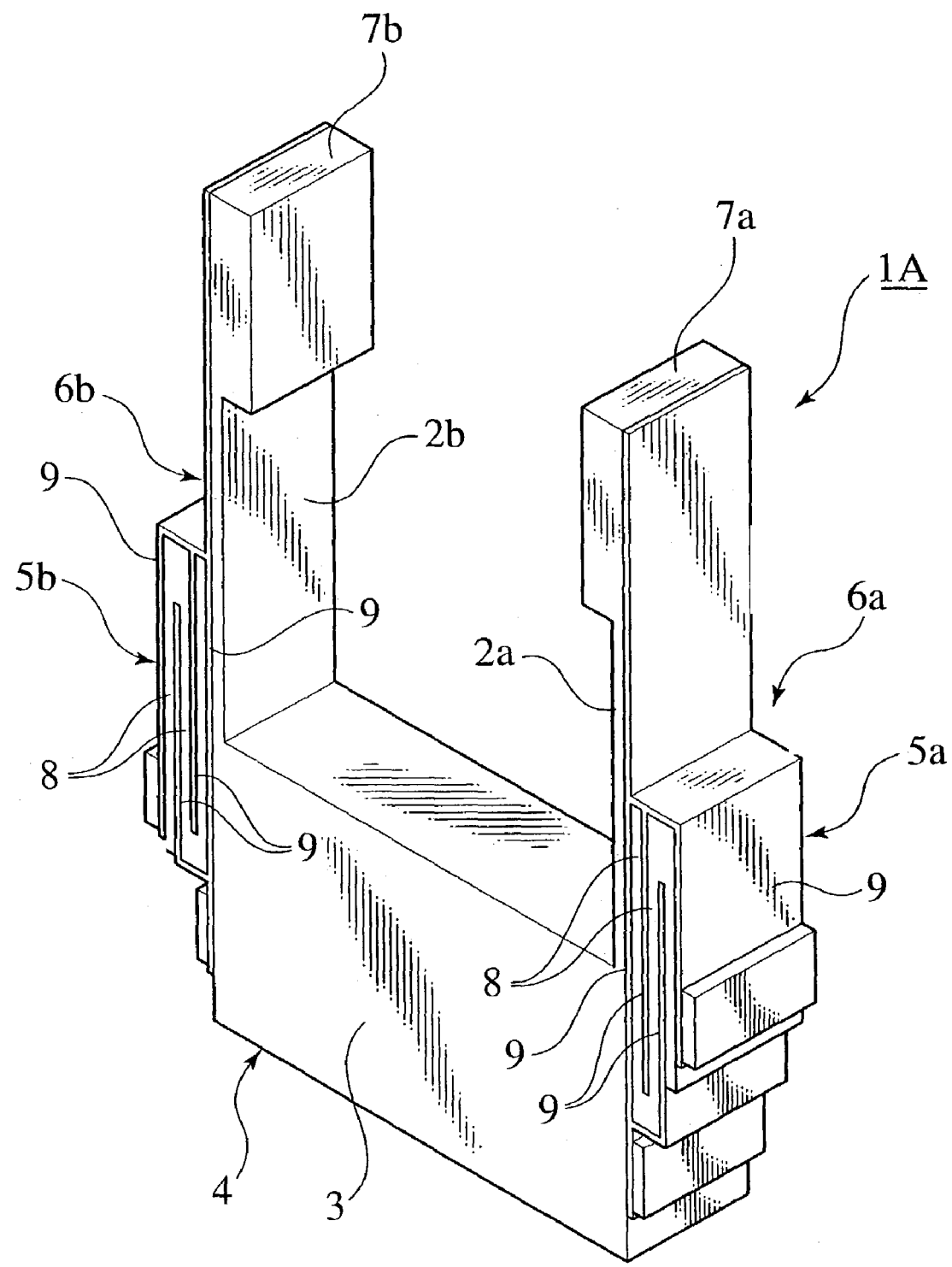
FIG. 1 is a perspective view showing a piezoelectric/electrostrictive device as a cut-processed component according to a first embodiment of the present invention.
Figure 3A:
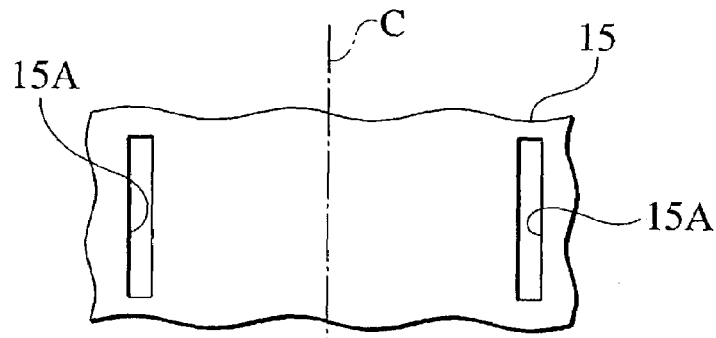
FIGS. 3A to 3E are plan views showing respective green sheets for constituting a first base material of the device of FIG. 1.
Figure 3B:
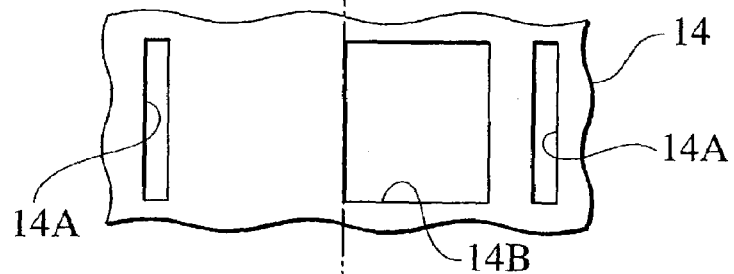
Figure 3C:
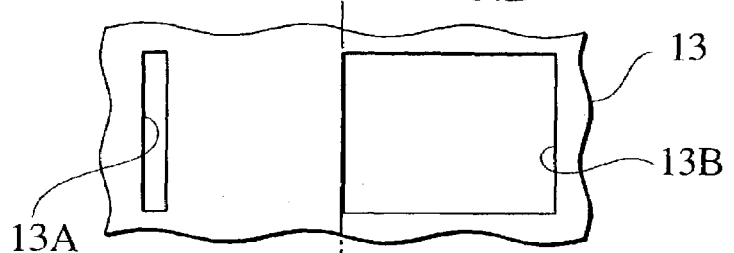
Figure 3D:
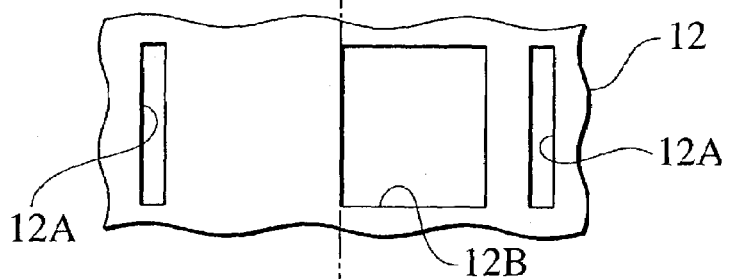
Figure 3E:
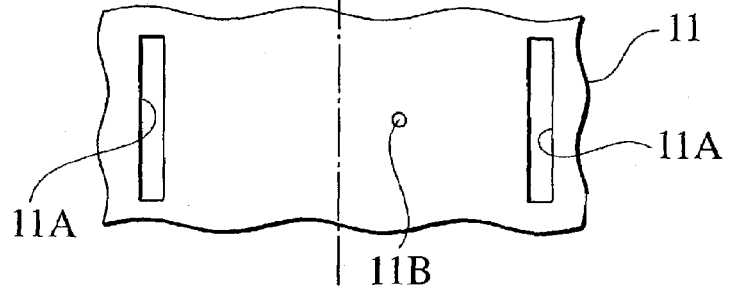

The embodiments of the present invention will be described with reference to the accompanying drawings. The embodiments illustrated in the drawings exhibit application of the present invention to a retaining structure for piezoelectric/electrostrictive devices as cut-processed components, a manufacturing method thereof, a tray for housing cut-processed components, and a cleaning method thereof. However, it is to be noted that the drawings are schematic, and thicknesses of respective material layers, the number of layers for lamination, ratios of film thicknesses, and the like are different from realities. The drawings also include cases where dimensional relations and ratios are different from one another. Illustration of piezoelectric/electrostrictive elements formed in a ceramic stacked body (a base material) will be omitted herein.

First Embodiment

A piezoelectric/electrostrictive device (hereinafter referred to as the "device") is equivalent to a concept which encompasses an element for mutually converting electric energy and mechanical energy by using a piezoelectric/electrostrictive element (hereinafter referred to as the "element"). This device is applied to an active element such as a variety of actuators or a vibrator. In particular, this device is used as a displacement element which utilizes displacement attributable to an inverse piezoelectric effect or an electrostrictive effect. The device is also usable as a passive element such as an acceleration sensor element or a shock sensor element.

Prior to explanation of a retaining structure for cut-processed components and a manufacturing method thereof, description will be made regarding a structure of the device as the cut-processed component.

As shown in FIG. 1, device 1A includes a pair of thin plates 2a and 2b which are facing each other. Device 1A includes fixing part 3 which supports plates 2a and 2b. Device 1A includes base body 4 on which fixing part 3 is integrally formed. Device 1A includes piezoelectric/electrostrictive elements 5a and 5b which are severally formed on thin plates 2a and 2b.

In device 1A, upon driving elements 5a and 5b, the pair of plates 2a and 2b are displaced, and meanwhile, elements 5a and 5b detect displacement of plates 2a and 2b. In FIG. 1, plates 2a and 2b, and elements 5a and 5b constitute actuators 6a and 6b, respectively.

The pair of plates 2a and 2b have thick parts, which are tip portions mutually protruding inward. The thick parts function as movable parts 7a and 7b which are displaced in response to displacement motions of thin plates 2a and 2b.

Base body 4 has a stacked structure of ceramics as a whole. Metal may be used for base body 4. Base body 4 may be also formed into a hybrid structure which combines ceramics and metal.

Base body 4 has the stacked structure which is integrated by baking laminated green sheets of ceramics. Base body 4 may adopt a structure formed by adhering respective parts with an adhesive. Base body 4 may adopt an integrated metallic structure integrated by brazing, soldering, eutectic bonding, welding or the like. An integrated ceramic structure hardly causes a change of state with time because no adhesive is interposed between bonding portions of respective parts. Accordingly, the integrated ceramic structure has high reliability of bonding regions and is also advantageous to rigidity reservation. Such a structure can be readily manufactured by the method of stacking ceramic green sheets, which will be described later.

Elements 5a and 5b include a plurality of stacked piezoelectric/electrostrictive layers 8. The elements include a plurality of electrodes 9 formed on both sides (front and back surfaces) of layers 8. Undermost layers 9 are formed along thin plates 2a and 2b.

Layers 8 and electrodes 9 severally contain multi-layer structures. Each of side faces of elements 5a and 5b is connected alternately to electrodes 9. Connected groups of electrodes 9 on the both side surfaces are stacked alternately and formed severally into comb shapes. The structure of the element is not only limited to a multi-layer structure, but may be also formed as a single-layer structure. The number of layers is not particularly limited.

Multi-layer-structured elements 5a and 5b increase driving force of actuators 6a and 6b. Such a structure allows large displacement and increases rigidity of elements 5a and 5b by themselves. The structure enables to have high resonance frequency and easily achieves speeding-up of displacement motions.

A method of manufacturing device 1A will be described. In FIG. 2, a raw material is subjected to the steps of preparing (S1), casting (S2), punching (S3), stacking (S4), electrode printing (S5), sintering (S6), cutting (S7), and separating (S8), and is thereby manufactured into devices 1A.

In FIG. 2, materials for ceramic green sheets (hereinafter referred to as the "green sheets") are blended to form base body 4. A binder, a solvent, a dispersant, and a plasticizer are added to and blended with ceramic powder of zirconia to produce slurry, and then the slurry is subjected to defoaming (Step S1).

The slurry is cast into tapes by a doctor-blade method, for example, by using an unillustrated lumirror (a poly-ethyleneterephthalate film) (Step S2).

The tape-shaped green sheets fabricated in the preceding step are punched into rectangles of given sizes (Step S3). Thus, five types of green sheets are obtained as shown in FIGS. 3A to 3E. Sheets 11 and 15 of FIGS. 3A and 3E severally include mutually parallel slots 11A and 15A on both ends thereof. Sheet 11 of FIG. 3E includes hole 11B for blowing air off upon stacking. Meanwhile, slots 12A and 14A are severally formed on both ends of sheets 12 and 14 of FIGS. 3B and 3D. Rectangular openings 12B and 14B are formed on one side relevant to center lines C between both slots 12A and slots 14A, respectively. Sheet 13 of FIG. 3C includes slot 13A on one end thereof. Sheet 13 includes rectangular opening 13B between center line C and the other end. Opening 13B has an area covering slots 12A and 14A as well as openings 12B and 14B on one side.

Five types of punched green sheets shown in FIGS. 3A to 3E are stacked and attached together by pressure, and first base material 10 is thereby fabricated (Step S4). Sheet 12 is stacked on sheet 11. Five pieces of sheet 13 are stacked on sheet 12. Sheets 14 and 15 are serially stacked on sheets 13, and first base material 10 of a stacked structure is thereby formed (Step 4, see FIG. 4). Base material 10 is divided into matrix regions to be cut into cut-processed components.

Elements 5 are severally formed on upper and lower surfaces (sheets 11 and 15) of base material 10 by a screen printing method, for example (Step S5).

Base material 10 is baked (main baking), or baked for adjusting curves if necessary (Step S6). To be more precise, elements 5 are formed by stacking platinum (Pt) films and PZT films repeatedly, baking the stacked films after printing the last Pt film, printing an Au film additionally, and baking the films again.

Base material 10 is cut by the following procedures (Step S7).

Figure 4:
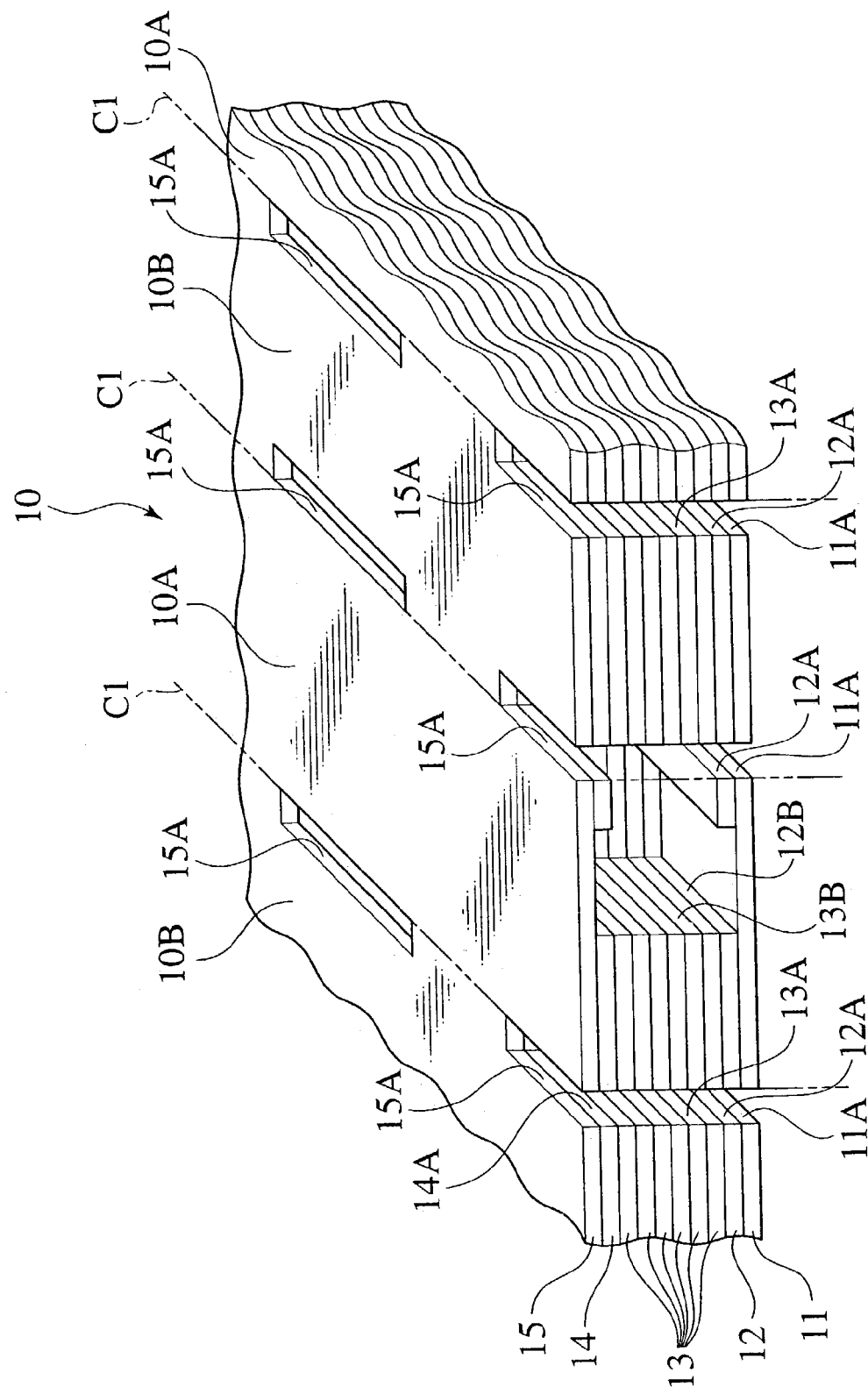
FIG. 4 is a perspective view showing the first base material formed by stacking the green sheets of FIGS. 3A to 3E.
Figure 5:
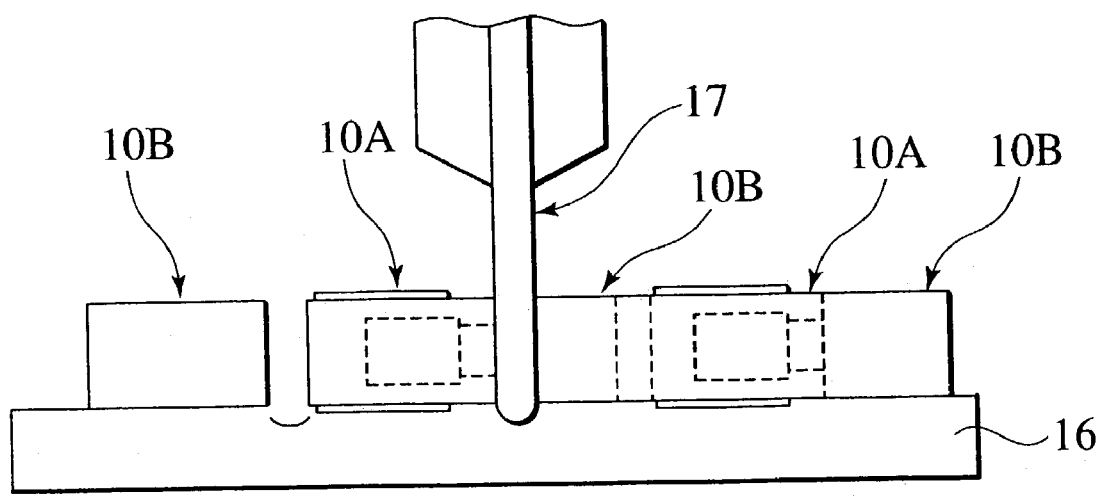
FIG. 5 is a front view showing a step of cutting the first base material of FIG. 4.

As shown in FIG. 5, base material 10 is coated with an adhesive and then adhered onto fixture 16 functioning as a supporting base. Base material 10 is cut along chain double-dashed lines C1, shown in FIG. 4, by using micro grinder 17 as shown in FIG. 5. As shown in FIGS. 4 and 5, such cutting fabricates second base materials 10A including a plurality of devices 1A, and fabricates unnecessary members 10B. Cutting is not limited to be performed by use of micro grinder 17, but also may be performed by a dicer using a UV film instead of fixture 16.

Figure 6:
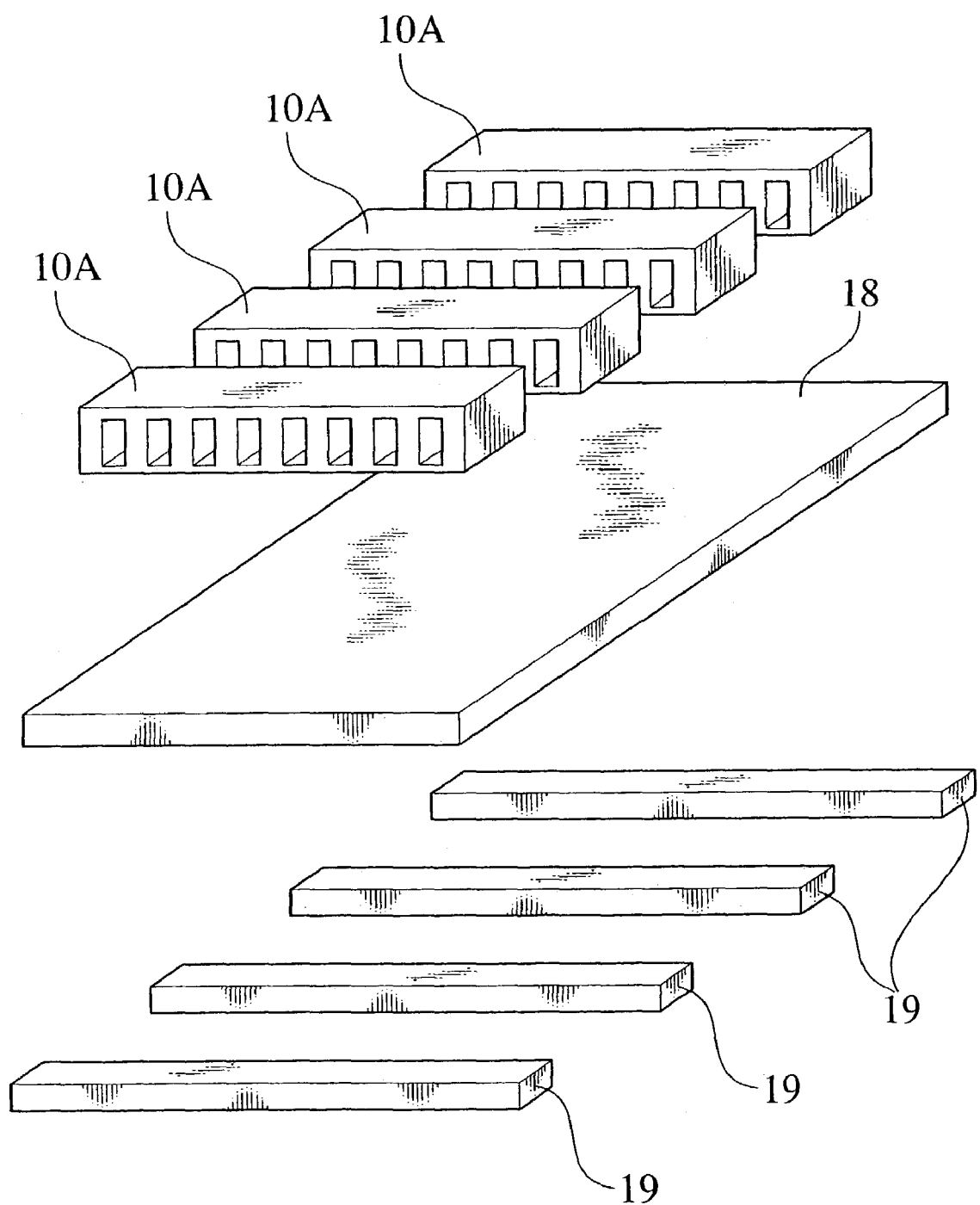
FIG. 6 is an exploded perspective view showing second base materials, a plate-shaped retaining base, and base members concerning the devices of FIG. 1.
Figure 7:
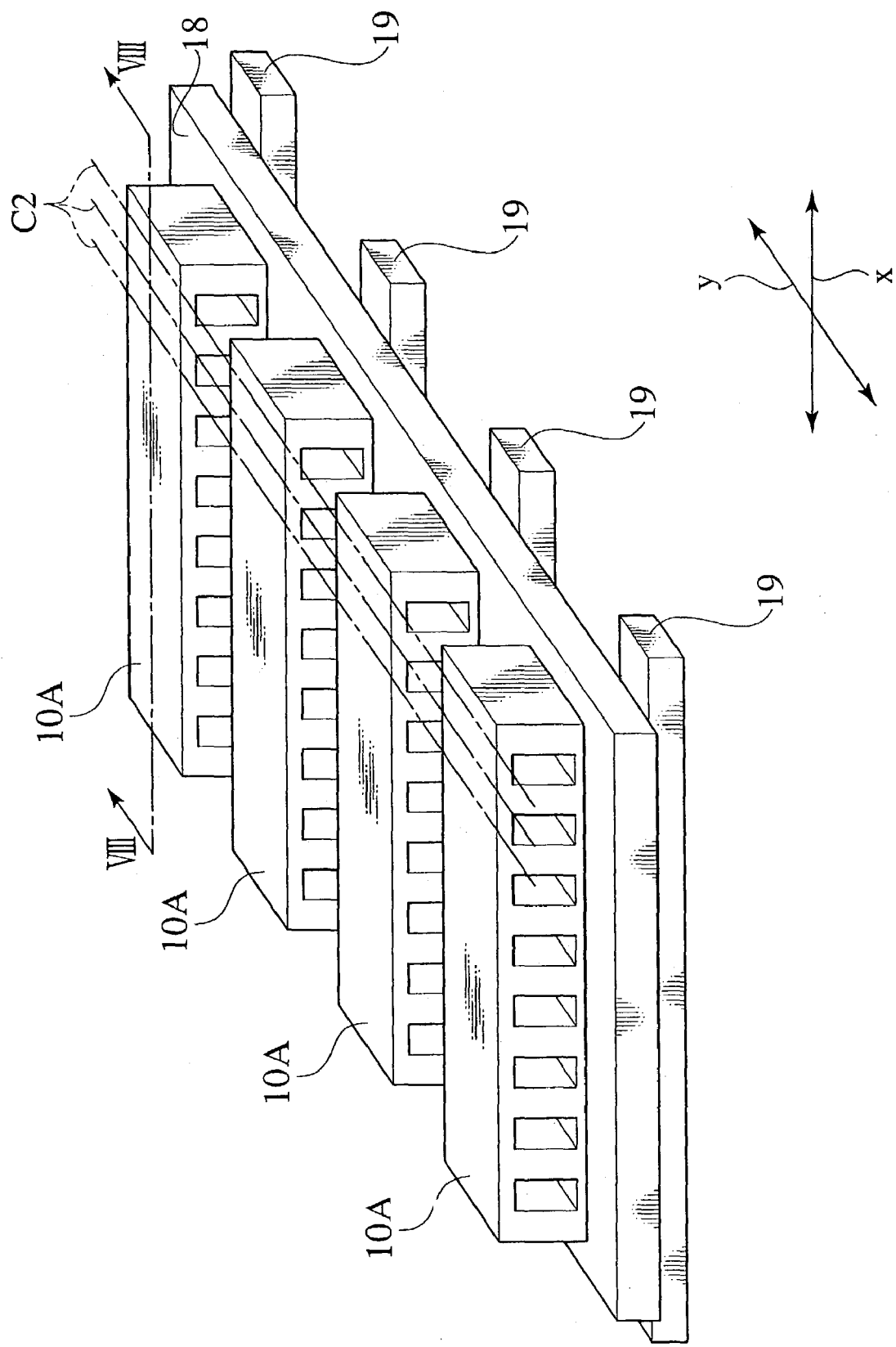
FIG. 7 is a perspective view showing the second base materials, the base, and the base members of FIG. 6, which are adhered together.
Figure 8:
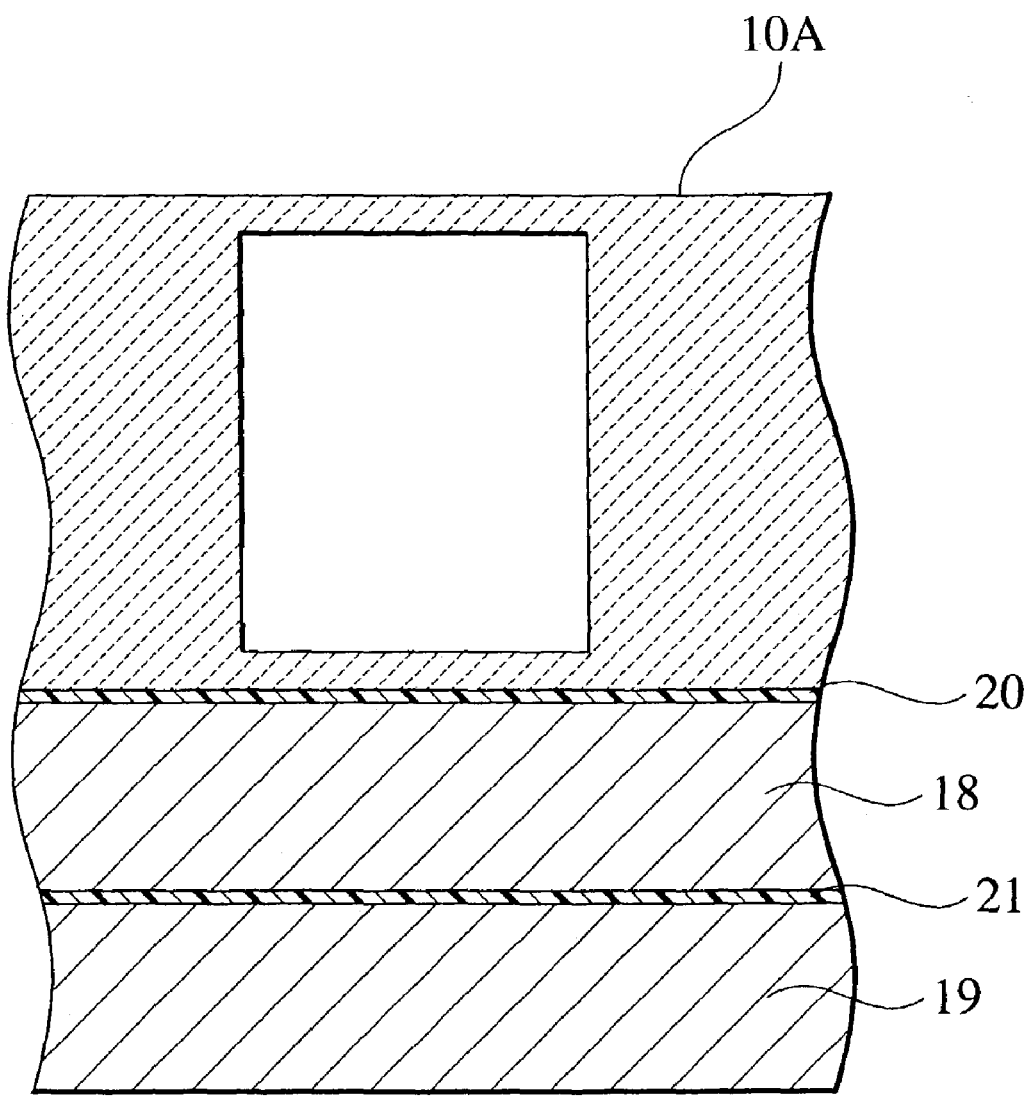
FIG. 8 is a cross-sectional view of substantial part taken along the VIII-VIII line in FIG. 7.

Base materials 10A are separated from fixture 16. As shown in FIGS. 6 and 7, base materials 10A are adhered to an upper surface of plate-shaped retaining base 18 which is made of silicon, for example, and are arranged mutually in parallel with given intervals. To a lower surface of base 18, a plurality of base members 19 made of ferrite, for example, are adhered mutually in parallel. As shown in FIG. 8, base material 10A and base 18 are mutually adhered with adhesive 20. Base 18 and base member 19 is mutually adhered with adhesive 21. Moreover, adhesive 20 and adhesive 21 have different conditions of dissolution, and are therefore dissolved by different solvents. For example, adhesive 20 is dissoluble in acetone. Meanwhile, for adhesive 21, wax dissoluble in a petroleum solvent is used.

Figure 9:
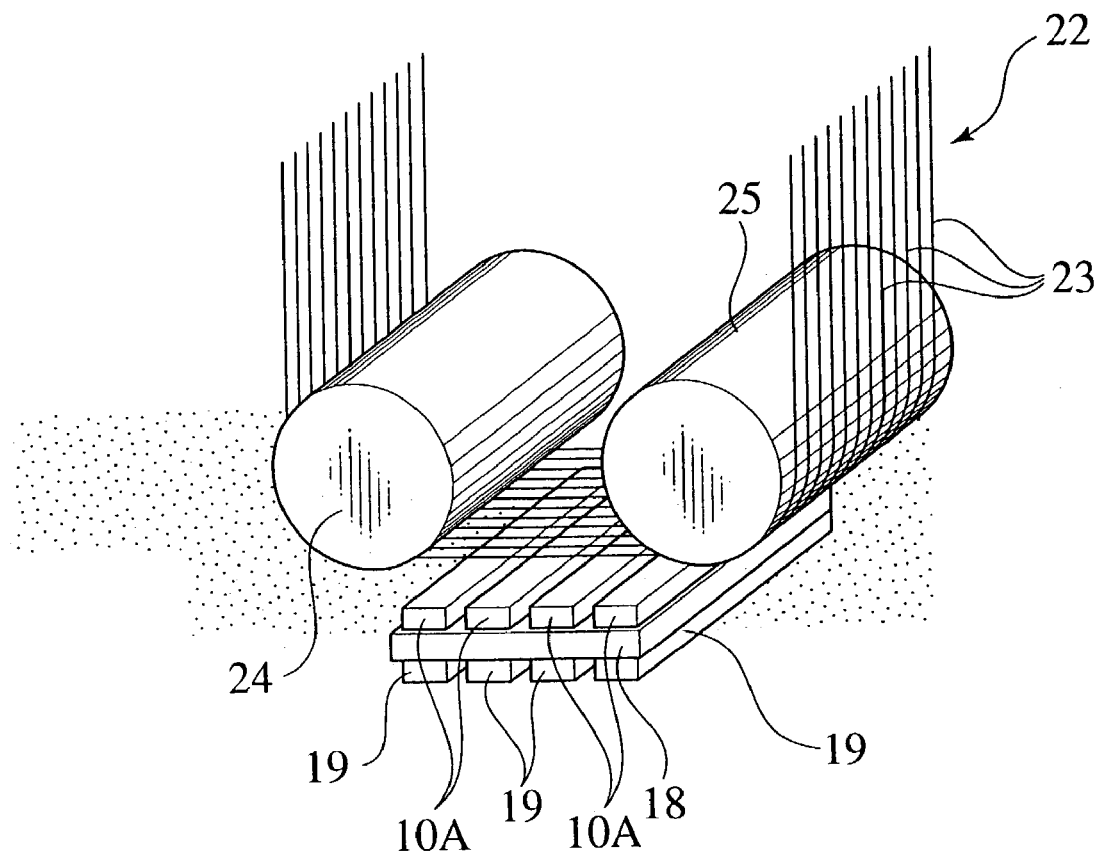
FIG. 9 is a perspective view showing a step of cutting the second base materials and the base of FIG. 7.

Wire saw 22 shown in FIG. 9 cuts base materials 10A together with base 18 (Step S7). This saw 22 includes an unillustrated table for mounting an object of cutting. Saw 22 includes at least a pair of rollers 24 and 25 which are located mutually in parallel above the table. Saw 22 includes a plurality of wires 23, which are tightly stretched between rollers 24 and 25. Rollers 24 and 25 can move up and down relative to the table. The object of cutting is cut by moving rollers 24 and 25 downward while driving wires 23.

Base materials 10A and base 18, which are the objects of cutting, are fixed on the table of wire saw 22 together with base members 19. Rollers 24 and 25 are gradually moved down while driving wires 23 along the direction indicated with chain lines in FIG. 7 (they direction), that is, along they direction shown in FIG. 9. Wires 23 cut base materials 10A and base 18 all at once.

Figure 10:
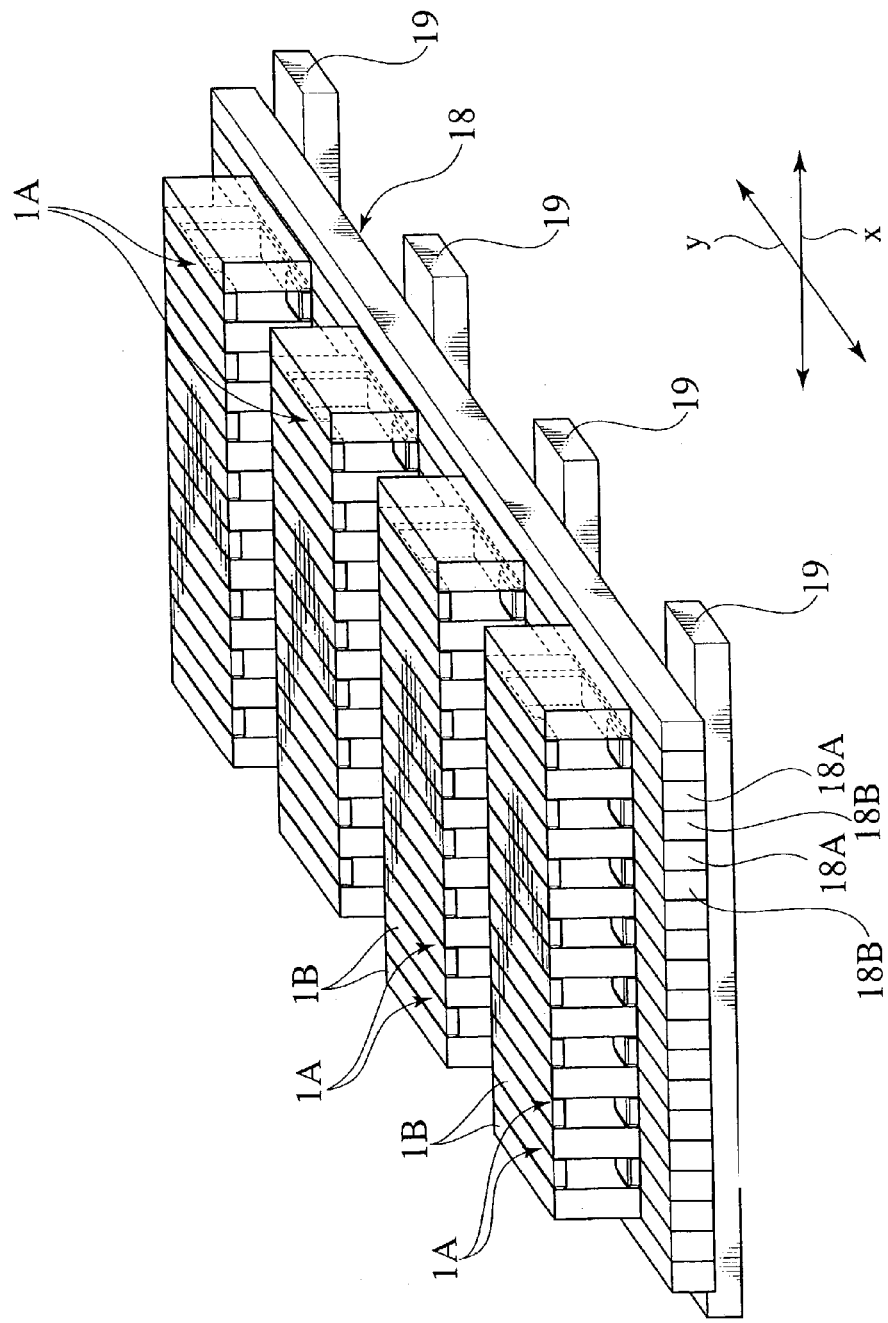
FIG. 10 is a perspective view showing the second base materials and the base of FIG. 7 after cutting.

As shown in FIG. 10, base 18 is cut and separated into bar-shaped bases 18A. Devices 1A are retained on base materials 18A in lines with given intervals, and along the longitudinal direction. Bases 18B are formed between devices 1A mutually adjacent to one another in the x direction, and bases 18B retain unnecessary parts included in base materials 10A. Bases 18A and 18B are fixed to base members 19 with adhesive 21.

Figure 11:
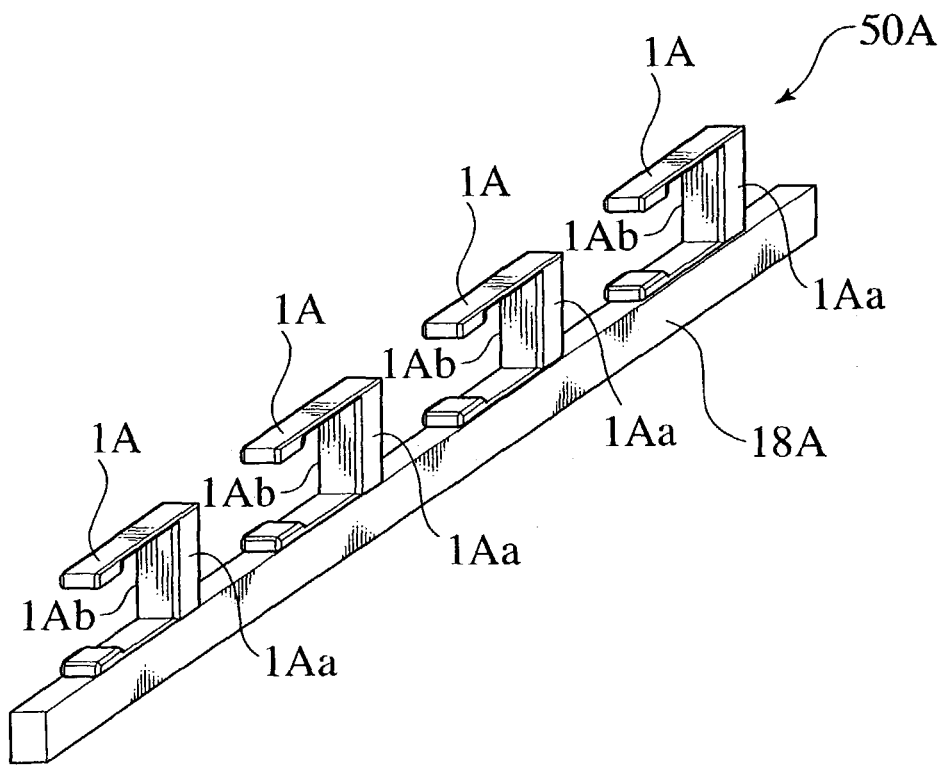
FIG. 11 is a perspective view showing intermediate products which are cut into integration of devices and the base.
Figure 12:
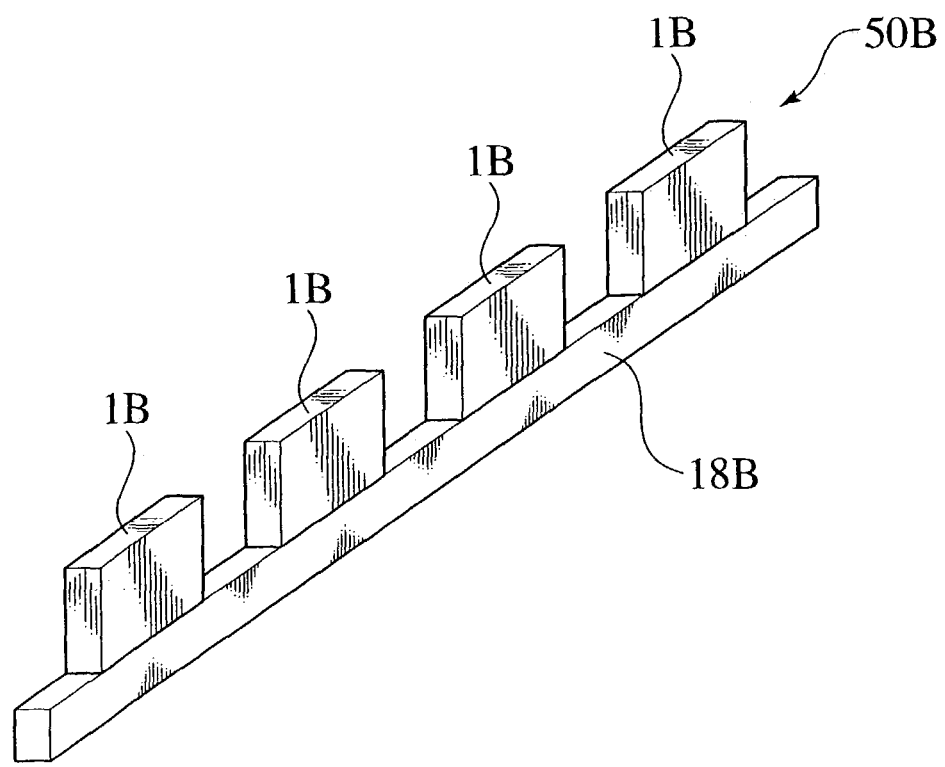
FIG. 12 is a perspective view showing an aggregation of unnecessary parts shown in FIG. 10, which is cut into integration of the base and the unnecessary parts.

Adhesive 21 is dissolved with a dissolutive agent (such as a petroleum solvent), and bases 18A are thereby separated from base members 19. As shown in FIG. 11, there is fabricated intermediate product 50A, where devices 1A are retained in a line on base 18A. As shown in FIG. 12, there is fabricated aggregation 50B, where unnecessary parts 1A are aligned on base 18B. Devices 1A aligned on base 18A severally include pairs of cut surfaces 1Aa and 1Ab. Cut surfaces 1Aa on one side are mutually located in one plane, and cut surfaces 1Ab on the other side are mutually located on another plane.

Since devices 1A are retained integrally on base 18A in one line, intermediate product 50A has an advantage of easiness of conveyance in a cluster. Grasping base 18A without directly touching devices 1A upon conveyance of intermediate product 50A can prevent devices 1A from damage.

Description will be made regarding the step of separating devices 1A from base 18A of intermediate product 50A and the step of cleaning devices 1A (Step S8). Description will be made regarding tray 30 for housing devices 1A. The tray 30 is used in the steps of separating and cleaning devices 1A.

Figure 13:
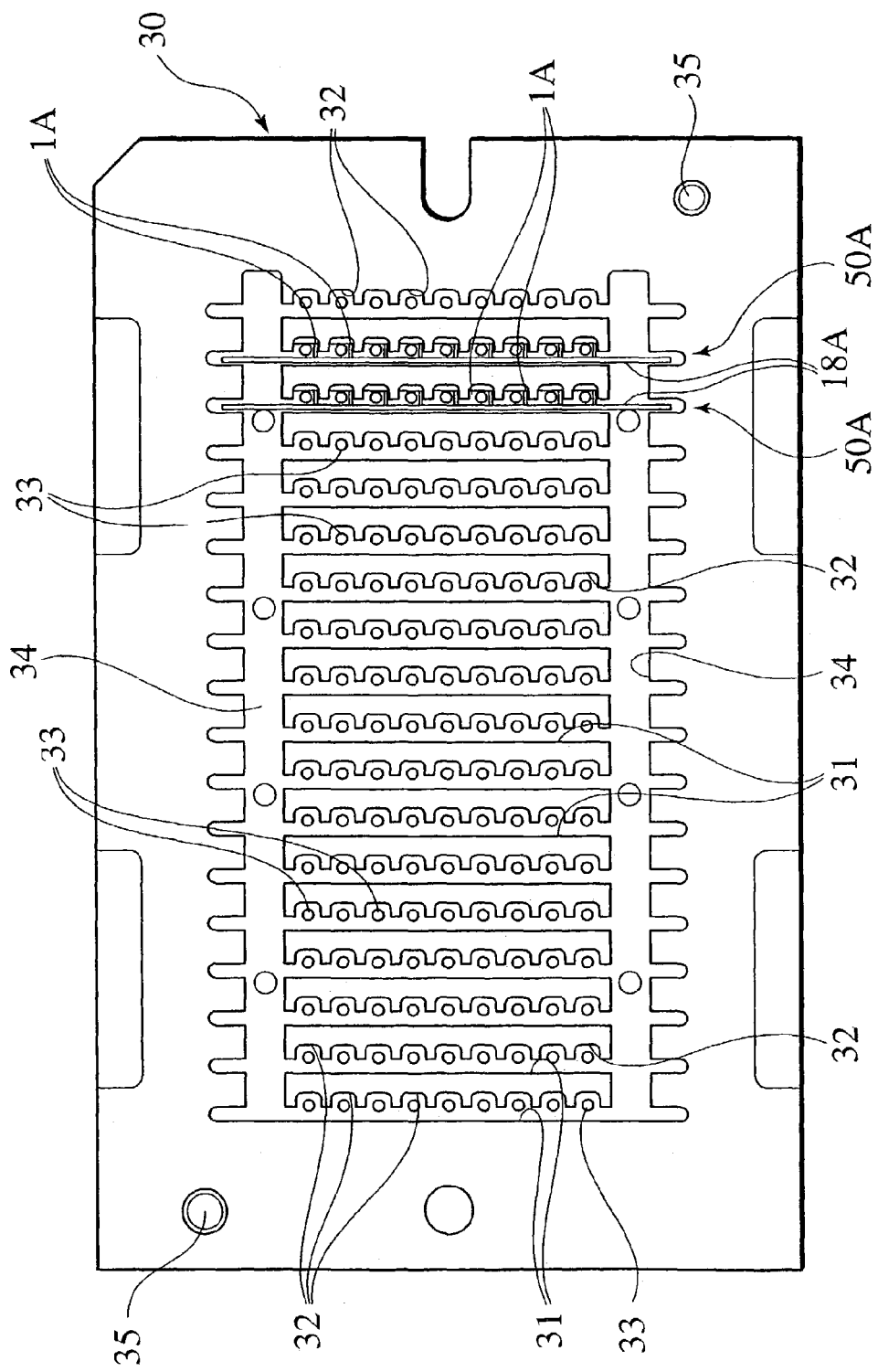
FIG. 13 is a plan view showing a tray to be used in the steps of manufacturing the device of FIG. 1.
Figure 15:
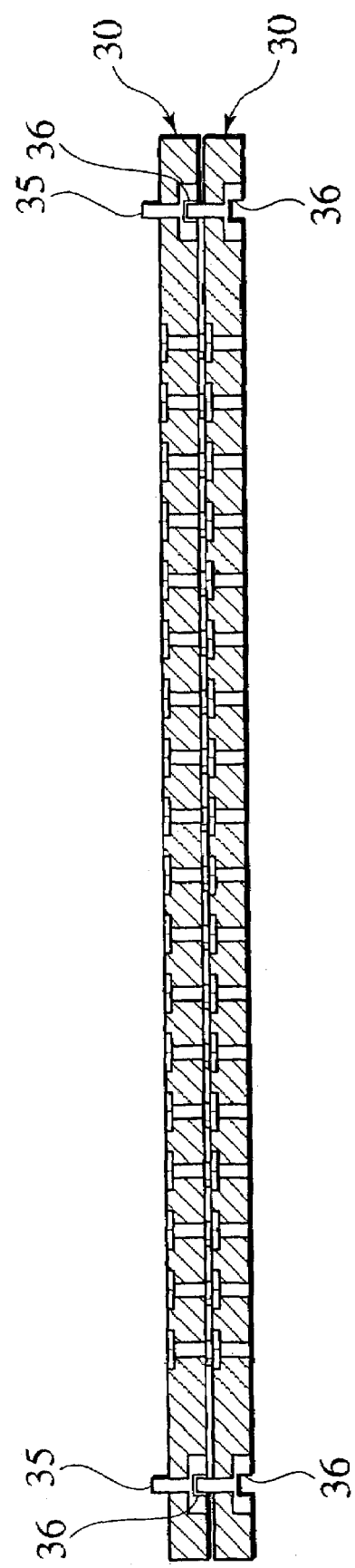
FIG. 15 is a cross-sectional view showing the stacked trays of FIG. 13.

FIG. 13 is a plan view showing tray 30 for housing devices 1A. Tray 30 includes housing channels 31 for housing bases 18A. Tray 30 includes a plurality of housing recesses 32 for housing respective devices 1A adhered to bases 18A. Channels 31 and recesses 32 communicate with each other. Through hole 33 is provided in the center of a bottom part of each recess 32 as a drainage hole for solvents. When device 1A is housed, hole 33 is located between plates 2a and 2b of device 1A. Tray 30 houses two intermediate products 50A, for example. Bases 18A are housed in channels 31, and devices 1A are housed in recesses 32. Both ends of a plurality of channels 31 communicate with a pair of connecting channels 34. Channels 34 are formed in the perpendicular direction to the longitudinal direction of channels 31. A pair of locating openings 36 are formed near the periphery of tray 30 as shown in FIGS. 13 and 15. Upon stacking, protrusions 35 installed on lower tray 30 are inserted into openings 36 provided on upper tray 30. Tray 30 is made of a material which is chemically stable against a solvent (a dissolutive agent) for adhesive 20 and a detergent to be described later. Here, the material includes metal such as stainless steel, a ceramic material, or synthetic resin, for example.

Description will be made regarding the step of separating devices 1A from intermediate products 50A and the step of cleaning devices 1A by using tray 30.

Figure 14:
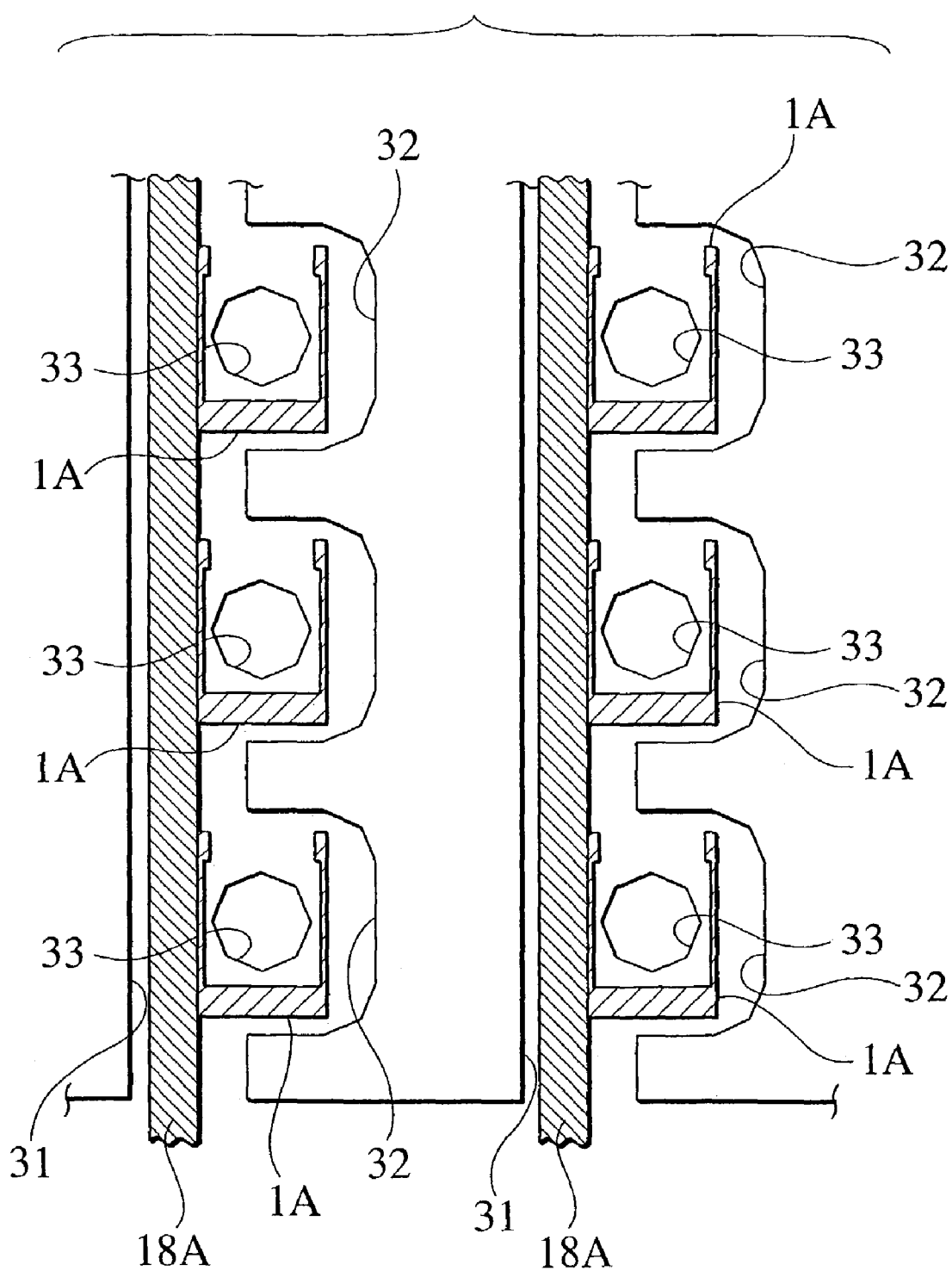
FIG. 14 is a plan view of substantial part of the tray of FIG. 13.
Figure 16:
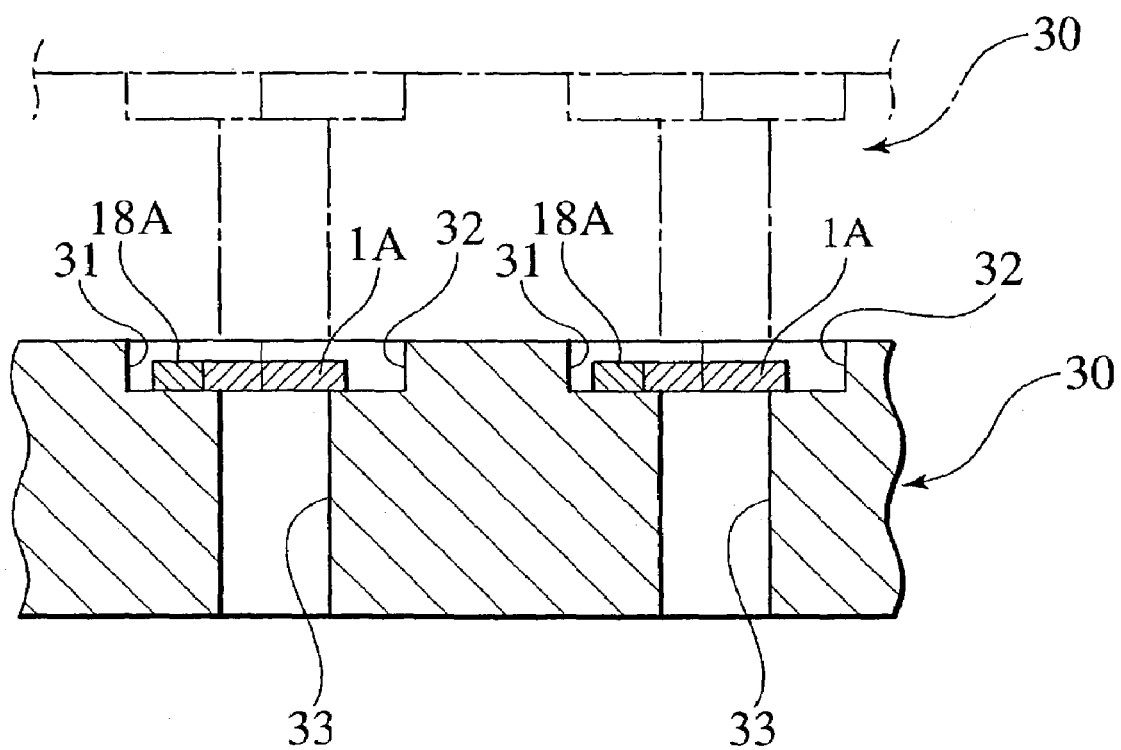
FIG. 16 is a cross-sectional view of substantial part of the trays shown in FIG. 15.

As shown in FIG. 14, integrated bases 18A and devices 1A are severally housed in channels 31 and recesses 32 of tray 30. If necessary, a plurality of trays 30 each housing intermediate products 50A are stacked as shown in FIGS. 15 and 16. Protrusions 35 on lower tray 30 are fitted into openings 36 of upper tray 30.

To dissolve adhesive 20 (see FIG. 8), trays 30 are immersed in a solvent (such as acetone) and shaken. The solvent may be poured on trays 30 to pervade channels 31 and recesses 32. Since trays 30 have holes 33 on the bottom parts of respective recesses 32, pouring the solvent on upper tray 30 allows the solvent to flow down to lower tray 30 as well. Linkage among recesses 32 and channels 31, and among channels 31 and channels 34 allows circulation of the solvent throughout tray 30.

Figure 17:
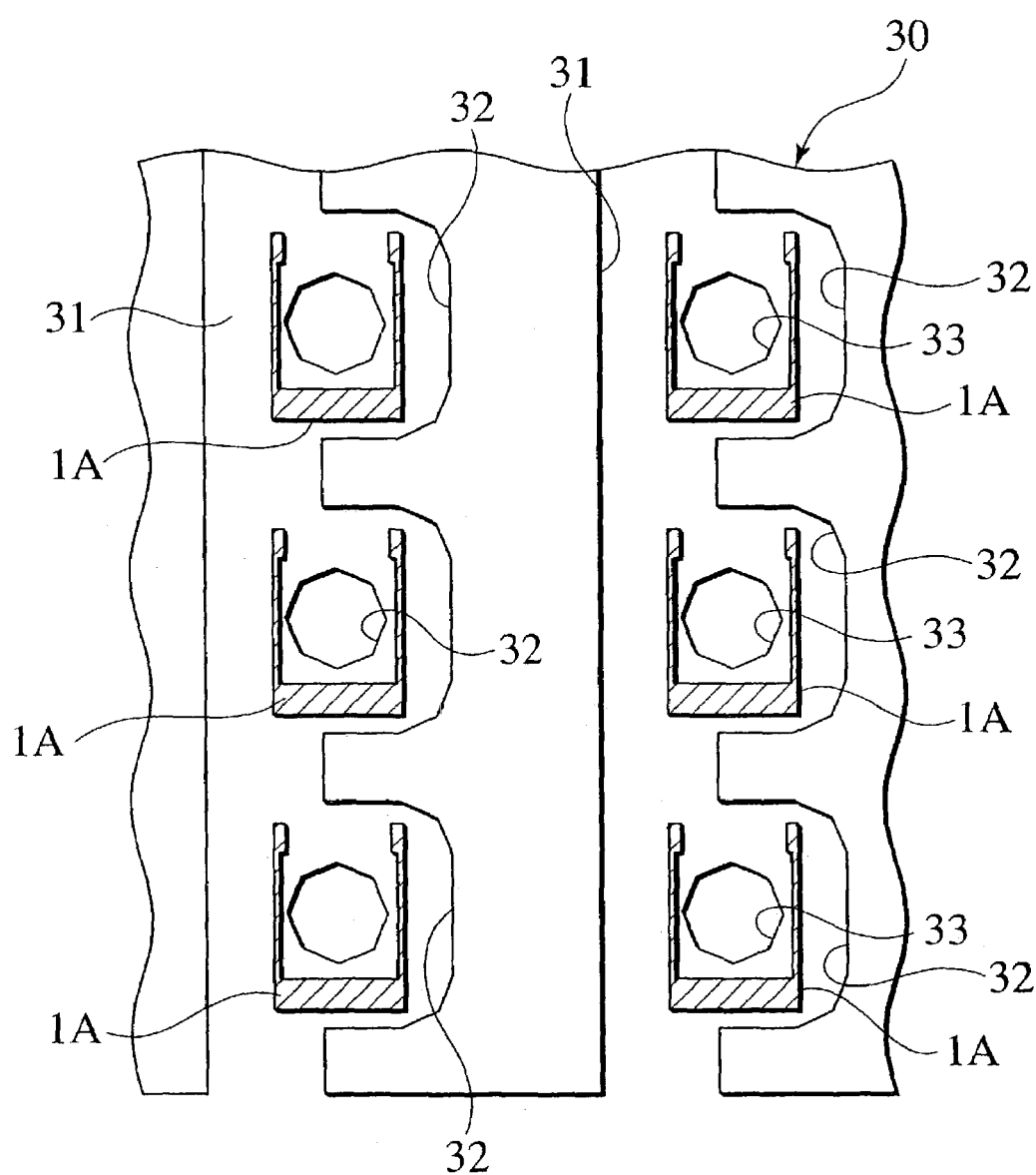
FIG. 17 is a plan view of substantial part showing the tray of FIG. 13 housing the separated devices.

As shown in FIG. 14, in the state where intermediate products 50A composed of integration of bases 18A and a plurality of devices 1A are housed in trays 30, each base 18A functions as one of inner walls of each recess 32. Thus, base 18A effectively reserves the solvent poured in recess 32. When bases 18A and devices 1A are separated due to dissolution of adhesive 20, bases 18A function to maintain positions of arrangement of devices 1A. As shown in FIG. 17, only devices 1A may be housed after separation from bases 18A, by removing bases 18A out of trays 30.

With devices 1A and bases 18A separated from each other, a detergent (a cleaning fluid) is poured in trays 30 and devices 1A are thereby cleaned. Through holes 33 allow the detergent to flow from upper tray 30 down to lower tray 30. The detergent circulates throughout tray 30 via channels 34.

The detergent may be poured in recesses 32, with separated bases 18A disposed in channels 31. As bases 18A function as part of the inner walls surrounding all four sides of recesses 32, devices 1A are securely immersed in the detergent.

Trays 30 houses cleaned devices 1A. Tray 30 is suitable for conveyance, and protects devices 1A housed therein. In an operation of setting devices 1A into a machine, tray 30 is supplied to a robotic hand, with tray 30 housing devices 1A therein. Accordingly, it is possible to re duce the risk of damaging devices 1A.

In this embodiment, base 18 cut together with second base material 10A constitutes base 18A. Treatment by grasping base 18A allows management and conveyance without directly grasping devices 1A. Such a retaining structure allows arranged devices 1A and bases 18A to be housed in trays 30 easily.

The retaining structure has an advantage that separation of devices 1A from bases after cutting and cleaning of devices 1A can be performed continuously in the state where devices 1A are housed in trays.

Second Embodiment

FIGS. 18 to 21 show a second embodiment of a method of manufacturing cut-processed products according to the present invention. Identical or similar reference numerals are attached to identical or similar constituents of the first embodiment, and detailed description thereof will be omitted herein.

Figure 18:
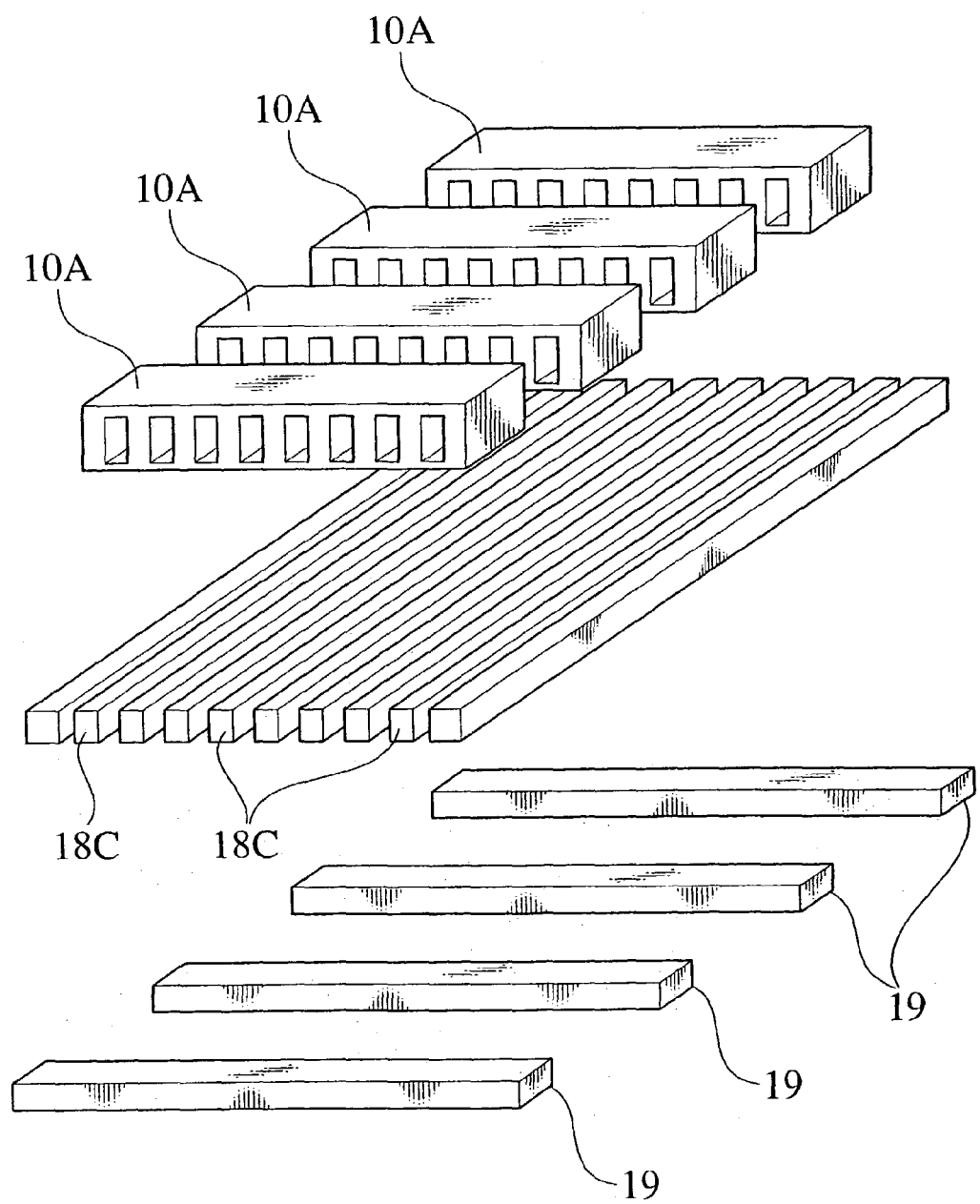
FIG. 18 is an exploded perspective view showing second base materials, bases, and base members of devices according to a second embodiment of the present invention.
Figure 19:
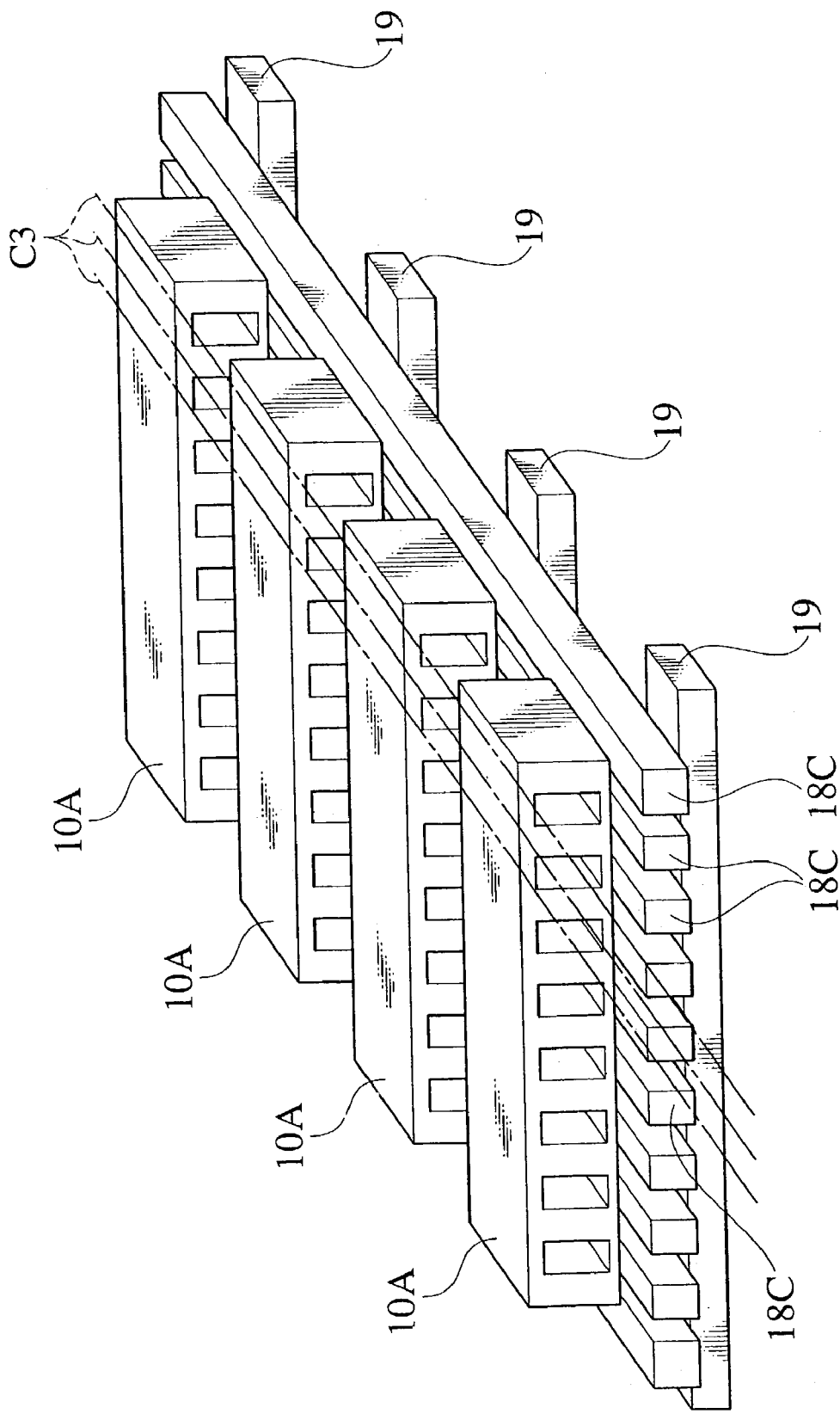
FIG. 19 is a perspective view showing the second base materials, the bases, and the base members of FIG. 18 after assembly.

As shown in FIG. 18, bar-shaped retaining bases 18C, second base materials 10A, and base members 19 are prepared. Bases 18C are formed into bars in advance. Width dimension of each base 18C is set narrower than thickness dimension of device 1A. Bases 18C are disposed mutually in parallel with given intervals. Base materials 10A are adhered onto bases 18C with adhesive 20 (see FIG. 8). Base materials 10A are disposed in the perpendicular direction to the longitudinal direction of bases 18C, and in parallel with given intervals. As shown in FIG. 19, bases 18C which are cut out are located under the lower surfaces of portions corresponding to devices 1A.

Base members 19 are adhered to lower surfaces of bases 18C with adhesive 21 (see FIG. 8). Base members 19 are disposed in the perpendicular direction to the longitudinal direction of bases 18C. In this embodiment, base materials 10A are adhered onto bases 18C, and then base members 19 are adhered to the lower surfaces of bases 18C. Alternatively, bases 18C may be adhered to base members 19, and then base materials 10A may be adhered onto bases 18C.

Figure 20:
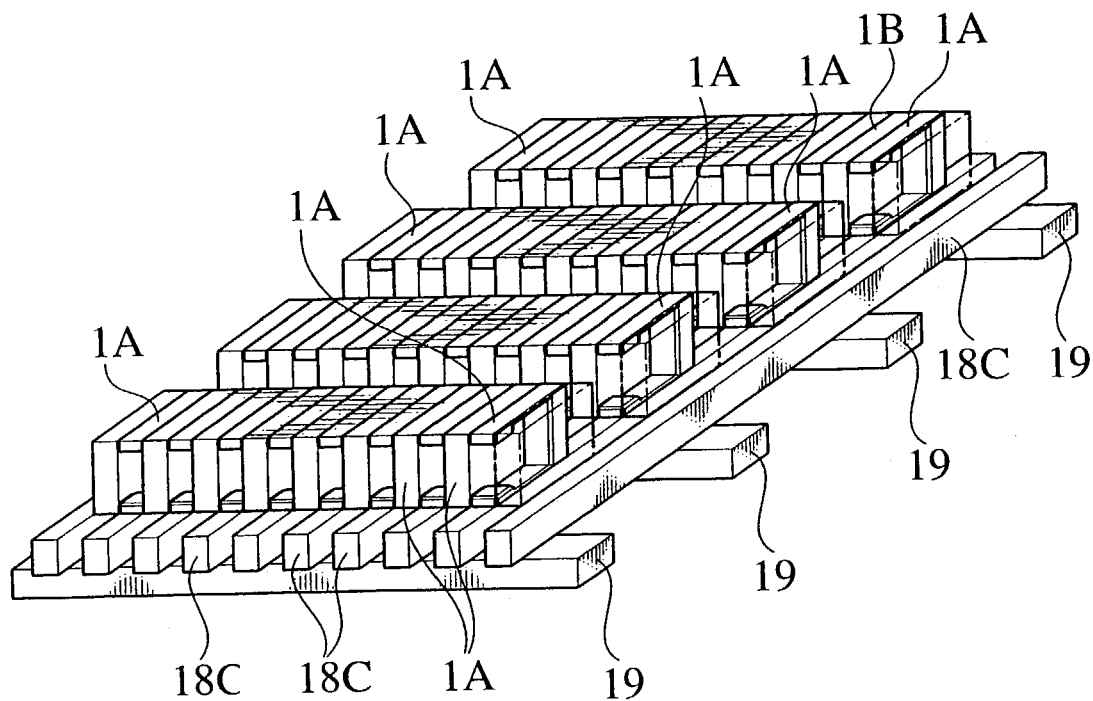
FIG. 20 is a perspective view showing the second base materials of FIG. 19 after cutting.

Wire saw 22 of FIG. 9 cuts base members 10A in positions between bases 18C as shown in FIG. 20. Such cutting forms intermediate products 50C, where devices 1A are disposed only on bases 18C. Unnecessary parts 1A of base materials 10A excluding devices 1A are not retained by bases 18C and are therefore separated from bases 18C.

Figure 21:
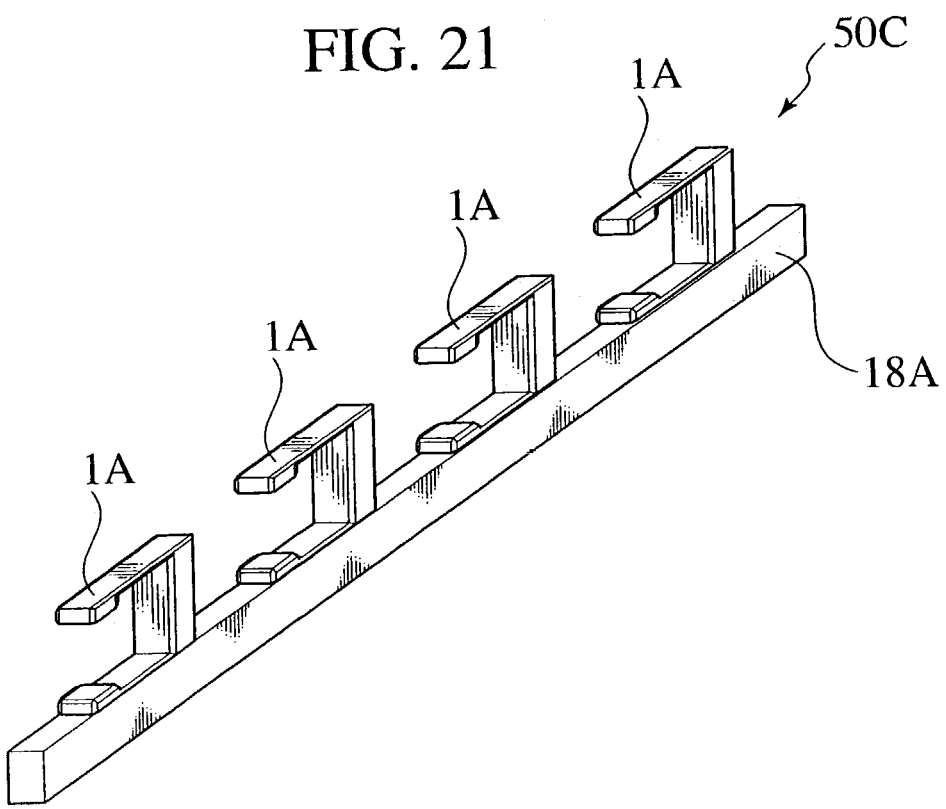
FIG. 21 is a perspective view showing the devices aligned and retained on the base in FIG. 20.

Bases 18C are then separated from base members 19. A specific dissolutive agent (a solvent) is used for adhesive 21. As shown in FIG. 21, there is fabricated intermediate product 50C, where devices 1A are retained in an aligned state on base 18C.

Other constitutions are similar to the above-described first embodiment. The step of separating devices 1A from base 18C, and the cleaning step are also similar to the first embodiment.

In this embodiment, bases 18C are formed into bars in advance, and only base materials 10A are cut in the cutting step. Time required for cutting can be shortened without bases 18C under cutting lines C3 of second base materials 10A. Thus, bases 18C are prevented from damage. After separating devices 1A from bases 18C, bases 18C can be used again for adhering base materials 10A. Such reuse can reduce costs of retaining bases.

The descriptions and the drawings which constitute part of the disclosure of the foregoing embodiments do not limit the scope of the invention. Various changes in the embodiments, examples and technologies for operations become apparent to those skilled in the art based on this disclosure.

This invention is also applicable to a variety of finished products and intermediate products of cut-processed components, including, electronic components such as chip capacitors, cut-processed products showing magnetic performances, products which exert strong absorption, micro components having large surface areas relative to volumes, and the like.

In particular, this invention is applicable to components which have been conventionally arranged one by one, for example, on a housing tray by hands of an operator, components which are difficult to be separated and arranged with a part feeder, and the like.

Although the respective embodiments herein adopted adhesives to be dissolved by solvents so as to effectuate separation of devices 1A from bases 18A or 18C, it is also possible to use an adhesive which can be discomposed by ultraviolet radiation.

Although tray 30 provided with connecting channels 34 is used in the first embodiment, it is also possible to constitute tray 30 without providing connecting channels 34.

The entire contents of Japanese Patent Applications P2002-029448 (filed on Feb. 6, 2002) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

According to the retaining structure, the cut-processed components are conveyed and handled in alignment. Each of the cut-processed components is removed from the first base in alignment.

According to the tray, flowing of the dissolutive agent or the detergent through the tray allows the cut-processed components to be removed or to be cleaned easily. The cut-processed components, removed from the first base, are stored or conveyed.

According to the cleaning method, the cut-processed components are collectively washed. The method allows the separation of the cut-processed components and the first base from each other and the cleaning of the cut-processed components, in the tray.

What is claimed is:

1. A method of fabricating cut-processed components, the method comprising:
adhering base materials to a first base with a first adhesive;
adhering the first base to a second base with a second adhesive different from the first adhesive in a dissolutive condition;
cutting the first base and the base materials in a direction to form cut-processed components from the base materials, with the cut-processed components being removably fixed and in alignment with each other on the first base; and
separating the first base and the second base from each other while maintaining the cut-processed components adhered to the first base.

2. A method of fabricating cut-processed components, the method sequentially comprising:
adhering base materials to a first base with a first adhesive;
adhering the first base to a second base with a second adhesive different from the first adhesive in a dissolutive condition;
cutting the first base and the base materials in a direction to form cut-processed components from the base materials, with the cut-processed components being removably fixed and in alignment with each other on the first base; and separating the first base and the second base from each other while maintaining the cut-processed components adhered to the first base.

* * * * *